United States Patent
Liu et al.

(10) Patent No.: US 12,284,871 B2
(45) Date of Patent: Apr. 22, 2025

(54) DISPLAY SUBSTRATE, DISPLAY PANEL AND DISPLAY DEVICE

(71) Applicant: KunShan Go-Visionox Opto-Electronics Co., Ltd., Kunshan (CN)

(72) Inventors: Rusheng Liu, Kunshan (CN); Junfeng Li, Kunshan (CN); Rubo Xing, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 783 days.

(21) Appl. No.: 17/541,814

(22) Filed: Dec. 3, 2021

(65) Prior Publication Data

US 2022/0093699 A1    Mar. 24, 2022

Related U.S. Application Data

(63) Continuation of application No. PCT/CN2020/110848, filed on Aug. 24, 2020.

(30) Foreign Application Priority Data

Nov. 7, 2019  (CN) .......................... 201911081662.5

(51) Int. Cl.
*H10K 59/121* (2023.01)
*H10K 59/65* (2023.01)
(Continued)

(52) U.S. Cl.
CPC ....... *H10K 59/121* (2023.02); *H10K 59/1213* (2023.02); *H10K 59/65* (2023.02);
(Continued)

(58) Field of Classification Search
CPC ............. H10K 59/121; H10K 59/1213; H10K 59/65; H10K 59/80515; H01L 27/1225;
(Continued)

(56) References Cited

U.S. PATENT DOCUMENTS

| 2011/0242686 A1 | 10/2011 | Watanabe |
| 2019/0103420 A1* | 4/2019 | Liu ..................... H01L 27/1248 |
| 2020/0312832 A1 | 10/2020 | Chi et al. |
| 2021/0066409 A1* | 3/2021 | Fan ..................... H10K 59/121 |

FOREIGN PATENT DOCUMENTS

| CN | 106873224 A | 6/2017 |
| CN | 108269840 A | 7/2018 |

(Continued)

OTHER PUBLICATIONS

State Intellectual Property Office of the People's Republic of China, Office Action and Search Report Issued in Application No. 2019110816625, Mar. 31, 2022, 14 pages. (Submitted with Partial Machine Translation).

(Continued)

*Primary Examiner* — Thanh Y. Tran
(74) *Attorney, Agent, or Firm* — Maier & Maier, PLLC

(57) ABSTRACT

A display panel and a display device. The display substrate includes: a first display area, a second display area, and a third display area. The second display area is located between the first display area and the third display area. A light transmittance of the first display area is greater than a light transmittance of the third display area. The display substrate includes first pixel circuits arranged in the first display area and arranged in an array, second pixel circuits arranged in the third display area and arranged in an array, and first pixel circuits and second pixel circuits arranged in the second display area and arranged in an array; and each of the first pixel circuits is different from each of the second pixel circuits.

19 Claims, 2 Drawing Sheets

(51) Int. Cl.
    *H10D 30/67*    (2025.01)
    *H10D 86/40*    (2025.01)
    *H10D 86/60*    (2025.01)

(52) U.S. Cl.
    CPC ..... *H10D 30/6745* (2025.01); *H10D 30/6755* (2025.01); *H10D 86/423* (2025.01); *H10D 86/471* (2025.01); *H10D 86/60* (2025.01)

(58) Field of Classification Search
    CPC ........... H01L 27/1251; H01L 29/78672; H01L 29/7869
    See application file for complete search history.

(56) References Cited

FOREIGN PATENT DOCUMENTS

| CN | 108389879 A | 8/2018 |
|---|---|---|
| CN | 109036121 A | 12/2018 |
| CN | 109378316 A | 2/2019 |
| CN | 109950288 A | 6/2019 |
| CN | 109962092 A | 7/2019 |
| CN | 110047386 A | 7/2019 |
| CN | 209070895 U | 7/2019 |
| CN | 209265332 U | 8/2019 |
| CN | 110379836 A | 10/2019 |
| CN | 110808267 A | 2/2020 |

OTHER PUBLICATIONS

ISA State Intellectual Property Office of the People's Republic of China, International Search Report Issued in Application No. PCT/CN2020/110848, Nov. 30, 2020, WIPO, 6 pages.

ISA State Intellectual Property Office of the People's Republic of China, Written Opinion of the International Searching Authority Issued in Application No. PCT/CN2020/110848, Nov. 30, 2020, WIPO, 6 pages.

State Intellectual Property Office of the People's Republic of China, Office Action and Search Report Issued in 3 Application No. 2019110816625, Aug. 24, 2021, 17 pages.

* cited by examiner

DISPLAY SUBSTRATE, DISPLAY PANEL AND DISPLAY DEVICE

CROSS REFERENCE TO RELATED APPLICATIONS

The present application is a continuation application of International Application No. PCT/CN2020/110848 filed on Aug. 24, 2020, which claims priority to Chinese Patent Application No. 201911081662.5, filed on Nov. 7, 2019, both of which are hereby incorporated by reference in their entireties.

TECHNICAL FIELD

The present application relates to the technical field of OLED display devices, and in particular, to display substrates, display panels, and display devices.

BACKGROUND

With the rapid development of display devices, users have increasingly higher requirements on screen-to-body ratio. Because components such as cameras, sensors and earphones need to be installed in a top area of a screen, a part of the top area of the screen is usually reserved for installing the above components, for example, a "notch" area of iPhone X, which affects an overall consistency of the screen. At present, full-screen display is receiving more and more attention from the industry.

SUMMARY

The present application provides display substrates, display panels, and display devices.

According to a first aspect of embodiments of the present application, there is provided a display substrate including: a first display area, a second display area, and a third display area; wherein the second display area is located between the first display area and the third display area; a light transmittance of the first display area is greater than a light transmittance of the third display area; the display substrate includes a plurality of first pixel circuits arranged in the first display area and arranged in an array, a plurality of second pixel circuits arranged in the third display area and arranged in an array, and a plurality of first pixel circuits and a plurality of second pixel circuits arranged in the second display area and arranged in an array; wherein the plurality of first pixel circuits are different from the plurality of second pixel circuits.

In an embodiment, the second display area includes N display sub-areas arranged in sequence in a first direction from the first display area to the third display area, and the display substrate includes a plurality of first pixel circuits and a plurality of second pixel circuits arranged in each of the N display sub-areas and arranged in an array, and along the first direction, a proportion of the plurality of first pixel circuits in the display sub-area decreases sequentially, and a proportion of the plurality of second pixel circuits in the display sub-area increases sequentially; wherein N is a positive integer.

Since the second display area includes the N display sub-areas arranged in sequence in the first direction from the first display area to the third display area, the display substrate includes a plurality of first pixel circuits and a plurality of second pixel circuits arranged in each of the N display sub-areas and arranged in an array, and along the first direction, the proportion of the plurality of first pixel circuits in the display sub-area decreases sequentially, and the proportion of the plurality of second pixel circuits in the display sub-area increases sequentially, in this way, a display brightness of the first display area can be gradually transitioned to a display brightness of the third display area, thereby avoiding an obvious boundary due to a large difference in display brightness between two adjacent display areas, and thus display effect is improved.

According to a second aspect of embodiments of the present application, there is provided a display panel, including: the above-mentioned display substrate and an encapsulation layer, wherein the display substrate is encapsulated by the encapsulation layer.

According to a third aspect of embodiments of the present application, there is provided a display device, including: a device body having a component area; the above-mentioned display panel, wherein the display panel covers the device body, the component area is located under the first display area, and the display device includes at least one electronic component arranged in the component area.

According to the above-mentioned embodiments, since the second display area is located between the first display area and the third display area, and the display substrate includes a plurality of first pixel circuits arranged in the first display area and arranged in an array, a plurality of second pixel circuits arranged in the third display area and arranged in an array, a plurality of first pixel circuits and a plurality of second pixel circuits arranged in the second display area and arranged in an array, wherein the plurality of first pixel circuits are different from the plurality of second pixel circuits, in this way, a display brightness of the second display area is between a display brightness of the first display area and a display brightness of the third display area, thereby avoiding an obvious boundary due to a large difference in display brightness between adjacent display areas, and thus display effect is improved.

DETAILED DESCRIPTION OF THE EMBODIMENTS

Various embodiments will be described in detail herein, examples of which are illustrated in the accompanying drawings. When the following descriptions involve the drawings, like numerals in different drawings represent like or similar elements unless stated otherwise. The implementations described in the following example embodiments do not represent all implementations consistent with the present application. Rather, they are merely examples of devices and methods consistent with some aspects of the present disclosure as detailed in the appended claims.

Figure 1:
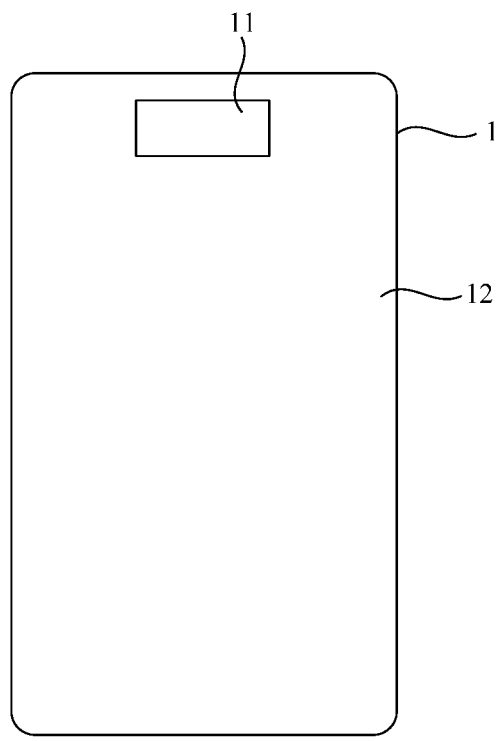
FIG. 1 is a schematic structural diagram exemplarily illustrating a full-screen.

As shown in FIG. 1, a full-screen 1 includes a transparent display area 11 and a non-transparent display area 12, the transparent display area 11 is light-transmitting and displayable. Photosensitive elements such as cameras, distance sensors, etc., and other electronic elements, such as speakers, flashlights, etc., can be disposed under the transparent display area 11. Since a plurality of pixel circuits of in the transparent display area 11 are different from a plurality of pixel circuits of in the non-transparent display area 12, there is a large difference in display brightness between the transparent display area 11 and the non-transparent display area 12, which leads to an obvious boundary between the transparent display area 11 and the non-transparent display area 12, and thus user experience is affected.

In view of the above technical problems, embodiments of the present application provide a display substrate, a display panel and a display device, which can make a gradual transition in display brightness of the display substrate and avoid an obvious boundary between adjacent display areas, and can improve display quality.

Figure 2:
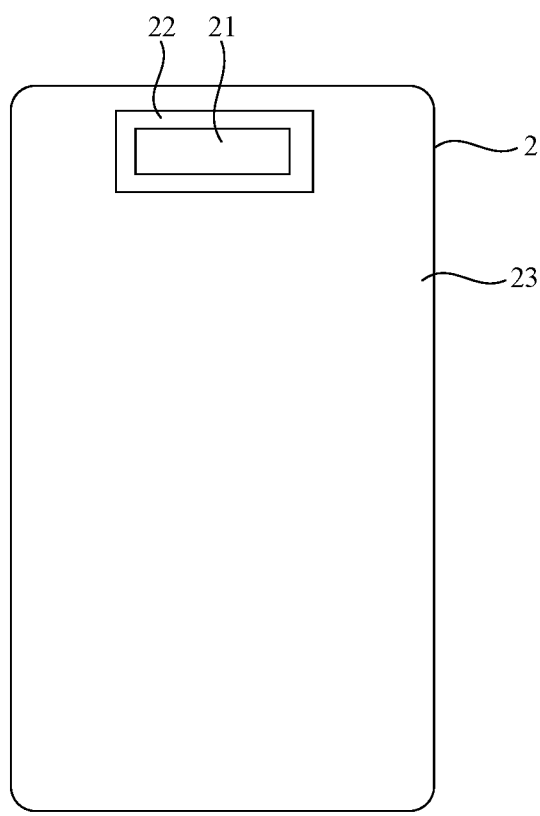
FIG. 2 is a schematic structural diagram illustrating a display substrate according to embodiments of the present application.

Embodiments of the present disclosure provide a display substrate. As shown in FIG. 2, the display substrate 2 includes: a first display area 21, a second display area 22 and a third display area 23. The second display area 22 is located between the first display area 21 and the third display area 23. A light transmittance of the first display area 21 is greater than a light transmittance of the third display area 23.

Figure 3:
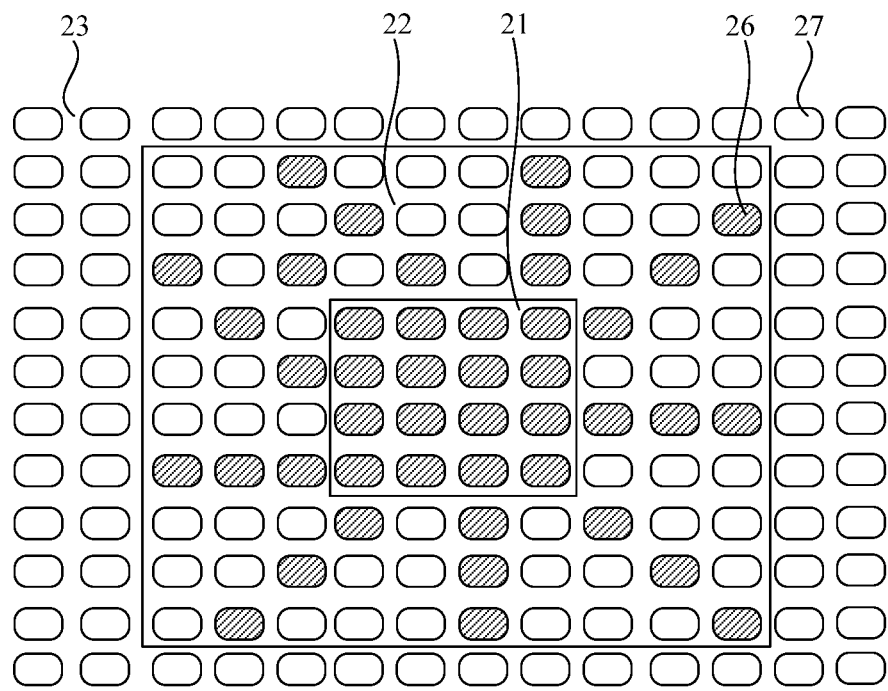
FIG. 3 is a schematic structural diagram of a sub-pixel arrangement of a display substrate shown in FIG. 2.

In this embodiment, as shown in FIG. 3, the display substrate 2 includes a plurality of first sub-pixels arranged in an array and a plurality of first pixel circuits 26 arranged in an array, the plurality of first sub-pixels arranged in an array and the plurality of first pixel circuits 26 arranged in an array are arranged in the first display area 21, and the plurality of first sub-pixels are connected with the plurality of first pixel circuits 26. The display substrate 2 includes a plurality of second sub-pixels arranged in an array and a plurality of second pixel circuits 27 arranged in an array, the plurality of second sub-pixels arranged in an array and the plurality of second pixel circuits 27 arranged in an array are arranged in the third display area 23, and the plurality of second sub-pixels are connected with the plurality of second pixel circuit 27. The display substrate 2 includes a plurality of first sub-pixels and a plurality of second sub-pixels arranged in an array and arranged in the second display area 22, the display substrate 2 also includes a plurality of first pixel circuits 26 and a plurality of second pixel circuits 27 arranged in the second display area 22 and arranged in an array, the first pixel circuits 26 are different from the second pixel circuits 27.

In this embodiment, since the second display area 22 is located between the first display area 21 and the third display area 23, and the display substrate 2 includes a plurality of first pixel circuits 26 arranged in the first display area 21 and arranged in an array, the display substrate 2 includes a plurality of second pixel circuits 27 arranged in the third display area 23 and arranged in an array, and the display substrate 2 includes a plurality of first pixel circuits 26 and a plurality of second pixel circuits 27 arranged in the second display area 22 and arranged in an array, each of the first pixel circuits 26 is different from each of the second pixel circuits 27, so that a display brightness of the second display area 22 is between a display brightness of the first display area 21 and a display brightness of the third display area 23. In this way, a display brightness of the display substrate 2 can be gradually transitioned, thereby avoiding an obvious boundary between adjacent display areas due to a large difference in display brightness between adjacent display areas, and thus display effect is improved.

Another embodiment of present application provides a structure of a sub-pixel arrangement of a display substrate.

Figure 4:
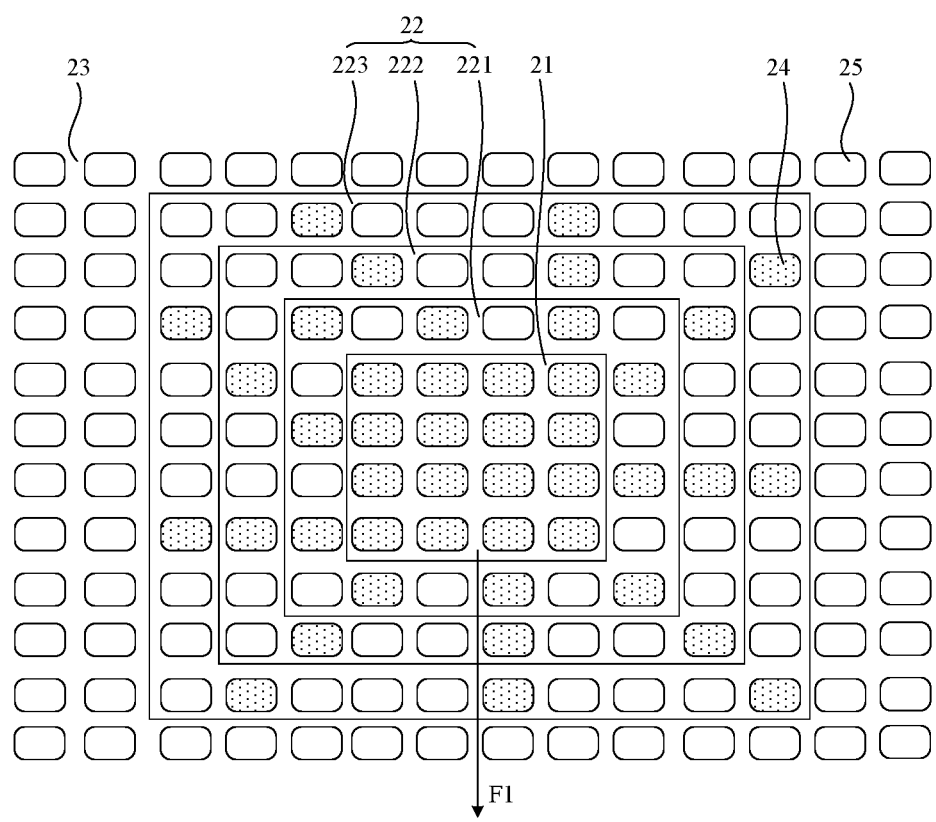
FIG. 4 is another schematic structural diagram of a sub-pixel arrangement of a display substrate shown in FIG. 2.

As shown in FIG. 4, the display substrate includes a plurality of first sub-pixels 24 arranged in a first display area 21 and arranged in an array, the display substrate includes a plurality of second sub-pixels 25 arranged in a third display area 23 and arranged in an array, and the display substrate includes a plurality of first sub-pixels 24 and a plurality of second sub-pixels 25 arranged in the second display area 22 and arranged in an array, wherein one first sub-pixel 24 is connected with one first pixel circuit, and one second sub-pixel 25 is connected with one second pixel circuit.

In some embodiments, the display substrate includes a plurality of first sub-pixels 24 arranged in the first display area 21 and arranged in an array, and one first sub-pixel 24 is connected with one first pixel circuit 26, and the first pixel circuit 26 can drive the first sub-pixel 24 to emit light. The display substrate includes a plurality of second sub-pixels 25 arranged in the third display area 23 and arranged in an array, one second sub-pixel 25 is connected with one second pixel circuit 27, and the second pixel circuit 27 can drive the second sub-pixel 25 to emit light. The display substrate includes a plurality of first sub-pixels 24 and a plurality of second sub-pixels 25 arranged in the second display area 22 and arranged in an array, one first sub-pixel 24 is connected with one first pixel circuit 26, the first pixel circuit 26 can drive the first sub-pixel 24 to emit light, one second sub-pixel 25 is connected with one second pixel circuit 27, and the second pixel circuit 27 can drive the second sub-pixel 25 to emit light. The first sub-pixels 24 and the second sub-pixels 25 in the second display area 22 are alternately distributed, and the first sub-pixels 24 in the display area 22 are uniformly distributed, the second sub-pixels 25 in the second display area 22 are uniformly distributed, and a density of the first sub-pixels 24 in the second display area 22 is substantially equal to a density of the second sub-pixels 25 in the second display area 22. Since the first sub-pixels 24 and the second sub-pixels 25 are mixedly arranged in the second display area 22, the display brightness of the second display area 22 is between the display brightness of the first display area 21 and the display brightness of the third display area 23, so that the display brightness of the display substrate can be gradually changed, thereby avoiding an obvious boundary between adjacent display areas due to a large difference in display brightness between adjacent display areas, and thus display effect is improved.

In this embodiment, the light transmittance of the first display area 21 is greater than the light transmittance of the second display area 22, and the light transmittance of the second display area 22 is greater than the light transmittance of the third display area 23.

Since the light transmittance of the first display area 21 is greater than the light transmittance of the second display area 22, the light transmittance of the second display area 22 is greater than the light transmittance of the third display area 23, that is, the light transmittance of the first display area 21 is gradually transitioned to the light transmittance of the third display area 23, and since the light transmittance can affect the display brightness, it is conducive to making the display brightness of the first display area 21 gradually transition to the display brightness of the third display area 23.

The above-mentioned first sub-pixel can be a sub-pixel of any color, the above-mentioned second sub-pixel can be a sub-pixel of any color. For example, the first sub-pixel can be a sub-pixel of red color, a sub-pixel of blue color, or a sub-pixel of green color. One first pixel can include adjacent first sub-pixels of different colors, similarly, one second pixel can include adjacent second sub-pixels of different colors.

As shown in FIG. 4, in this embodiment, the second display area 22 includes N display sub-areas arranged in sequence in a first direction F1 from the first display area 21 to the third display area 23, for example, three display sub-areas 221, 222, and 223. The display substrate includes a plurality of first sub-pixels 24 and a plurality of second sub-pixel 25 arranged in an array and arranged in each of the N display sub-areas. The display substrate includes a plurality of first pixel circuits and a plurality of second pixel circuits arranged in an array and arranged in each of the N display sub-areas, and along the first direction F1, a proportion of the plurality of first sub-pixels 24 in the display sub-area of the N display sub-areas decreases sequentially, a proportion of the plurality of first pixel circuits in the display sub-area of the N display sub-areas decreases sequentially, and a proportion of the plurality of second sub-pixels 25 in the display sub-area of the N display sub-areas increases sequentially, a proportion of the plurality of second pixel circuits in the display sub-area of the N display sub-areas increases sequentially, wherein N is a positive integer. For example, N can be 1, 2, 3, 4, and other positive integers.

For example, as shown in FIG. 4, N can be three. The second display area 22 includes three display sub-areas 221, 222, and 223 arranged in sequence in the first direction F1. The display substrate includes a plurality of first sub-pixels 24 and a plurality of second sub-pixels 25 arranged in each of the three display sub-areas and arranged in an array, one first sub-pixel 24 is connected with one first pixel circuit 26, and one second sub-pixel 25 is connected with one second pixel circuit 27. The first sub-pixels 24 are uniformly distributed in each of the three display sub-areas, and the second sub-pixels 25 are uniformly distributed in each of the three display sub-areas. A density of the first sub-pixels 24 in the display sub-area 221 is greater than a density of the first sub-pixels 24 in the display sub-area 222, and the density of the first sub-pixels 24 in the display sub-area 222 is greater than a density of the first sub-pixels 24 in the display sub-area 223; a density of the second sub-pixels 25 in the display sub-area 221 is smaller than a density of the second sub-pixels 25 in the display sub-area 222, and the density of the second sub-pixels 25 in the display sub-area 222 is smaller than a density of the second sub-pixels 25 in the display sub-area 223.

Similarly, a density of the first pixel circuits 26 in the display sub-area 221 is greater than a density of the first pixel circuits 26 in the display sub-area 222, and the density of the first pixel circuits 26 in the display sub-area 222 is greater than a density of the first pixel circuits 26 in the display sub-area 223; a density of the second pixel circuits 27 in the display sub-area 221 is smaller than a density of the second pixel circuits 27 in the display sub-area 222, and the density of the second pixel circuits 27 in the display sub-area 222 is smaller than a density of the second pixel circuit 27 in the display sub-area 223.

For example, when N is three, a proportion of the first sub-pixels 24 in the display sub-area 221 can be 75%, a proportion of the first sub-pixels 24 in the display sub-area 222 can be 50%, a proportion of the sub-pixels 24 in the display sub-area 223 can be 25%. A proportion of the second sub-pixels 25 in the display sub-area 221 can be 25%, a proportion of the second sub-pixels 25 in the display sub-area 222 can be 50%, and a proportion of the second sub-pixels 25 in the display sub-area 223 can be 75%.

Similarly, a proportion of the first pixel circuits 26 in the display sub-area 221 can be 75%, a proportion of the first pixel circuits 26 in the display sub-area 222 can be 50%, and a proportion of the first pixel circuits 26 in the display area 223 can be 25%. A proportion of the second pixel circuits 27 in the display sub-area 221 can be 25%, a proportion of the second pixel circuits 27 in the display sub-area 222 can be 50%, and a proportion of the second pixel circuits 27 in the display sub-area 223 can be 75%.

Since the second display area includes N display sub-areas arranged in sequence in the first direction F1 from the first display area to the third display area, the display substrate includes a plurality of first sub-pixels and a plurality of second sub-pixels arranged in an array and arranged in each of the N display sub-areas. The display substrate includes a plurality of first pixel circuits and a plurality of second pixel circuits arranged in an array and arranged in each of the N display sub-areas. Along the first direction F1, the proportion of the first sub-pixels in the display sub-area decreases sequentially, the proportion of the first pixel circuits in the display sub-area decreases sequentially, and the proportion of the second sub-pixels in the display sub-area increases sequentially, the proportion of the second pixel circuits in the display sub-area increases sequentially, so that the display brightness of the first display area can be gradually transitioned to the display brightness of the third display area, thereby avoiding an obvious boundary due to a large difference in display brightness between two adjacent display areas, and thus display effect is improved.

In this embodiment, the first sub-pixel is different from the second sub-pixel. In some embodiments, the first sub-pixels can be transparent sub-pixels, and the second sub-pixels can be non-transparent sub-pixels. In other words, a light transmittance of the first sub-pixel is greater than a light transmittance of the second sub-pixel. For example, in this embodiment, each of the plurality of first sub-pixels 24 can include a first electrode, a first organic light-emitting layer, and a second electrode, wherein the first organic light-emitting layer is located on the first electrode, and the second electrode is located on the first organic light-emitting layer. The first electrode can be a transparent anode. A material of the first electrode can be transparent ITO (Indium Tin Oxide), Graphene, IZO (Indium Zinc Oxide) or ITZO (Indium Tin Zinc Oxide), but is not limited thereto. Each of the plurality of second sub-pixels 25 can include a third electrode, a second organic light emitting layer, and a fourth electrode, wherein the second organic light emitting layer is located on the third electrode, and the fourth electrode is located on the second organic light emitting layer. The third electrode can be a reflective anode. The third electrode can include a first transparent conductive layer, a metal layer and a second transparent conductive layer. A material of the first transparent conductive layer and a material of the second transparent conductive layer can be ITO, and a material of the metal layer can be Ag (argentum), but is not limited thereto.

In this embodiment, the first electrode can include f electrode blocks, and the first organic light-emitting layer can include f light-emitting structures corresponding to the f electrode blocks, that is, one light-emitting structure is provided on one electrode block, f is a positive integer. For example, f can be 1, 2, 3, or other positive integers. When f is greater than 1, one first pixel circuit 26 can drive a plurality of light-emitting structures of one first sub-pixel 24 to emit light, and thus reducing the number of pixel circuits in the first display area 21, weakening a granular sensation of the display and improving display effect.

In this embodiment, a projection of the first electrode in a plane where the display substrate is located includes at least one graphic unit, and a shape of the graphic unit can be circular, elliptical, dumbbell, gourd, or rectangular. When the shape of the graphic unit is circular, elliptical, dumbbell or gourd, a periodic structure that produces diffraction can be changed, that is, a distribution of diffraction field is changed, thereby reducing diffraction. Further, when a pixel camera (image sensor) is provided under the first display area 21, it can be ensured that an image obtained by the pixel camera under the first display area 21 has a higher definition.

In this embodiment, the number of components of one first pixel circuit 26 is smaller than or equal to the number of components of one second pixel circuit 27. In some embodiments, the first pixel circuit 26 is an nTmC pixel circuit, and the second pixel circuit 27 is a jTkC pixel circuit, wherein n+m≤j+k, T represents a transistor, C represents a capacitor, n is a positive integer, and m is a natural number, j is a positive integer, and k is a natural number. For example, n is 1, 2, 3, 4, 5, 6 or 7, but it is not limited thereto; m can be 0, 1 or 2, but is not limited thereto; j is 1, 2, 3, 4, 5, 6 or 7, but is not limited thereto; k can be 0, 1 or 2, but is not limited thereto. That is, a sum of the number of transistors and the number of capacitors in the first pixel circuit 26 is less than or equal to a sum of the number of transistors and the number of capacitors in the second pixel circuit 27. When the sum of the number of transistors and the number of capacitors in the first pixel circuit 26 is less than the sum of the number of transistors and the number of capacitors in the second pixel circuit 27, the light transmittance of the first pixel circuit 26 is greater than the light transmittance of the second pixel circuit 27, which is beneficial to increase the light transmittance of the first display area 21.

For example, the above-mentioned nTmC pixel circuit can be a 1T pixel circuit, a 2T1C pixel circuit, a 3T1C pixel circuit, a 4T1C pixel circuit, a 5T1C pixel circuit, a 6T1C pixel circuit, or a 7T1C pixel circuit. The above-mentioned jTkC pixel circuit can be a 1T pixel circuit, a 2T1C pixel circuit, a 3T1C pixel circuit, a 4T1C pixel circuit, a 5T1C pixel circuit, a 6T1C pixel circuit, or a 7T1C pixel circuit. Herein, the nTmC pixel circuit refers to a pixel circuit including n transistors and m capacitors. For example, a 2T1C pixel circuit refers to a pixel circuit including two transistors and one capacitor. Similarly, the jTkC pixel circuit refers to a pixel circuit including j transistors and k capacitors.

For example, in an embodiment, the first pixel circuit 26 is a 2T1C pixel circuit, and the second pixel circuit 27 is a 7T1C pixel circuit. An area occupied by the 2T1C pixel circuit can be smaller than an area occupied by the 7T1C pixel circuit, and an opening area of the first sub-pixel 24 can be smaller than an opening area of the second sub-pixel 25. When the opening area of the first sub-pixel 24 is smaller than the opening area of the second sub-pixel 25, and a luminous intensity of the first sub-pixel 24 is equal to a luminous intensity of the second sub-pixel 25, the display brightness of the first display area 21 is less than the display brightness of the third display area 23. In order to reduce a difference between the display brightness of the first display area 21 and the display brightness of the third display area 23, the luminous intensity of the first pixels in the first display area 21 can be appropriately increased. Of course, the luminous intensity of the first pixels in the second display area 22 can be appropriately higher than the luminous intensity of the second pixels in the second display area 22.

In another embodiment, the number of transistors in a first pixel circuit 26 can be equal to the number of transistors in a second pixel circuit 27, and the number of capacitors in the first pixel circuit 26 can be equal to the number of capacitors in the second pixel circuit 27. Specifically, n=j and m=k. A transistor in the first pixel circuit 26 is a low-temperature polysilicon (LTPS) transistor, and a transistor in the second pixel circuit 27 is a low-temperature polycrystalline oxide (LTPO) transistor. Since an electron mobility of the low-temperature polycrystalline oxide transistor is higher than an electron mobility of the low-temperature polysilicon transistor, the low-temperature polycrystalline oxide transistor is more stable than the low-temperature polysilicon transistor, and a power consumption of the low-temperature polycrystalline oxide transistor is less than a power consumption of the low-temperature polysilicon transistor, therefore, compared with the transistor in the first pixel circuit 26 and the transistor in the second pixel circuit 27 both being low-temperature polysilicon transistors, when the number of transistors in the first pixel circuit 26 is equal to the number of transistors in the second pixel circuit 27, the number of capacitors in the first pixel circuit 26 is equal to the number of capacitors in the second pixel circuit 27, the transistors in the first pixel circuit 26 are low-temperature polysilicon transistors, and the transistors in the second pixel circuit 27 are low-temperature polycrystalline oxide transistors, it is convenient to improve a resolution and a refresh rate of the third display area 23 and reduce a power consumption of the third display area 23.

In another embodiment, when n=j and m=k, a transistor in the first pixel circuit 26 can be a low-temperature polycrystalline oxide transistor, and a transistor in the second pixel circuit 27 can be a low-temperature polysilicon transistor. Compared with the transistor in the first pixel circuit 26 and the transistor in the second pixel circuit 27 both being low-temperature polysilicon transistors, when the number of transistors in the first pixel circuit 26 is equal to the number of transistors in the second pixel circuit 27, the number of capacitors in the first pixel circuit 26 is equal to the number of capacitors in the second pixel circuit 27, and the transistors in the first pixel circuit 26 are low-temperature polycrystalline oxide transistors, and the transistors in the second pixel circuit 27 are low-temperature polysilicon transistors, it is convenient to improve a resolution and a refresh rate of the first display area 21, and reduce a power consumption of the first display area 21.

In this embodiment, the number of the first sub-pixels 24 in per unit area of the first display area 21 is less than a sum of the number of the first sub-pixels 24 and the number of the second sub-pixels 25 in per unit area of the second display area 22, the number of the first sub-pixels 24 in per unit area of the first display area 21 is less than the number of the second sub-pixels 25 in per unit area of the third display area 23. Since the number of the first sub-pixels 24 in per unit area of the first display area 21 is less than the sum of the number of the first sub-pixels 24 and the number of the second sub-pixels 25 in per unit area of the second display area 22, the light transmittance of first display area 21 is greater than the light transmittance of the second display area 22. Since the number of the first sub-pixels 24 in per unit area of the first display area 21 is less than the number of the second sub-pixels 25 in per unit area of the third display area 23, the light transmittance of the first display area 21 can be greater than the light transmittance of the third display area 23.

The number of the first sub-pixels 24 in per unit area of the first display area 21 can be equal to the sum of the number of first sub-pixels 24 and the number of the second sub-pixels 25 in per unit area of the second display area 22, the number of first sub-pixels 24 in per unit area of the first display area 21 can be equal to the number of the second sub-pixels 25 in per unit area of the third display area 23. Since the number of the first sub-pixels 24 in per unit area of the first display area 21 is equal to the sum of the number of the first sub-pixels 24 and the number of the second sub-pixels 25 in per unit area of the second display area 22, a difference in display brightness between the first display area 21 and the second display area 22 can be reduced, thereby avoiding an obvious boundary due to a large difference in display brightness between the adjacent first display area 21 and the second display area 22. Since the number of the first sub-pixels 24 in per unit area of the first display area 21 is equal to the number of the second sub-pixels 25 in per unit area of the third display area 23, a difference in display brightness between the first display area 21 and the third display area 23 can be reduced.

In this embodiment, a shape of the first display area 21 can be a rectangle, a circle, or an ellipse, but it is not limited thereto. The first display area 21 can be completely surrounded by the second display area 22 and the third display area 23, or can be partially surrounded by the second display area 22 and the third display area 23.

Embodiments of the present application further provide a display panel including a display substrate described in any of the above embodiments, and an encapsulation layer. The display substrate is encapsulated by the encapsulation layer.

In this embodiment, since a second display area 22 is located between a first display area 21 and a third display area 23, and the display substrate includes a plurality of first pixel circuits 26 arranged in the first display area 21 and arranged in an array, the display substrate includes a plurality of second pixel circuits 27 arranged in the third display area 23 and arranged in an array, and the display substrate includes a plurality of first pixel circuits 26 and a plurality of second pixel circuits 27 arranged in the second display area 22 and arranged in an array. Each of the plurality of first pixel circuits 26 is different from each of the plurality of second pixel circuits 27. In this way, a display brightness of the second display area 22 can be between a display brightness of the first display area 21 and a display brightness of the third display area 23, thereby avoiding an obvious boundary due to a large difference in display brightness between adjacent display areas, and thus display effect is improved.

Embodiments of the present application further provide a display device. The display device includes: a device body and a display panel described in any of the above embodiments.

The device body has a component area, the display panel covers the device body, the component area is located under the first display area, and the device body includes at least one electronic component arranged in the component area.

In this embodiment, the above-mentioned at least one electronic component can include at least one of a distance sensor, a microphone, a speaker, a flash, a pixel camera, an infrared lens, a flood light sensor, an ambient light sensor, and a dot projector.

The display device in the embodiments can be any product or device enabling displaying, such as an electronic paper, a mobile phone, a tablet computer, a television, a notebook computer, a digital photo frame, a navigator, and the like.

In the accompanying drawings, dimensions of layers and regions may have been exaggerated for clarity of illustration.

It is to be understood that when an element or a layer is referred to as being "above" or "on" another element or layer, it may be directly on the another element, or intervening layers may be present. In addition, it is to be understood that when an element or a layer is referred to as being "under" or "below" another element or layer, it may be directly under the another element, or one or more intervening layers or elements may be present. In addition, it is to be understood that when a layer or an element is referred to as being "between" two layers or two elements, it may be the only layer between the two layers or two elements, or one or more intervening layers or elements may be present. Like reference numerals indicate like elements throughout.

In the present disclosure, terms "first" and "second" are used for descriptive purposes only and are not to be construed as indicating or implying a relative importance. The term "a plurality" indicates two or more, unless specifically defined otherwise.

Those skilled in the art will readily conceive other embodiments of the present application upon consideration of the specification and practice of the various embodiments disclosed herein. The application is intended to cover any variations, uses, or adaptations of the present application following general principles of the present application and include the common general knowledge or common technical means in the art without departing from the present application. The specification and examples are indicated by the appended claims.

The invention claimed is:

1. A display substrate, comprising:
 a first display area,
 a second display area and
 a third display area, wherein the second display area is located between the first display area and the third display area, a light transmittance of the first display area is greater than a light transmittance of the third display area;
 wherein the display substrate comprises:
 a plurality of first pixel circuits and a plurality of second pixel circuits,
  some of the plurality of first pixel circuits are arranged in the first display area and arranged in an array;
  some of the plurality of second pixel circuits are arranged in the third display area and arranged in an array; and
  others of the plurality of first pixel circuits and others of the plurality of second pixel circuits are arranged in the second display area and arranged in an array;
  wherein all of the plurality of first pixel circuits are the same as each other and all of the plurality of second pixel circuits are the same as each other.

2. The display substrate according to claim 1, wherein the second display area comprises N display sub-areas arranged in sequence in a first direction from the first display area to the third display area,
 the display substrate comprises the plurality of first pixel circuits and the plurality of second pixel circuits arranged in each of the N display sub-areas and arranged in an array, and
 along the first direction, a proportion of the plurality of first pixel circuits in the display sub-area decreases sequentially, and a proportion of the plurality of second pixel circuits in the display sub-area increases sequentially; wherein N is a positive integer.

3. The display substrate according to claim 1, wherein each first pixel circuit of the plurality of first pixel circuits is an nTmC pixel circuit, each second pixel circuit of the plurality of second pixel circuits is a jTkC pixel circuit, n+m≤j+k, n is a positive integer, m is a natural number, j is a positive integer, and k is a natural number.

4. The display substrate according to claim 3, wherein the nTmC pixel circuit is a 1T pixel circuit, a 2T1C pixel circuit, a 3T1C pixel circuit, a 4T1C pixel circuit, a 5T1C pixel circuit, a 6T1C pixel circuit, or a 7T1C pixel circuit;
the jTkC pixel circuit is a 1T pixel circuit, a 2T1C pixel circuit, a 3T1C pixel circuit, a 4T1C pixel circuit, a 5T1C pixel circuit, a 6T1C pixel circuit, or a 7T1C pixel circuit.

5. The display substrate according to claim 3, wherein, when n=j and m=k, a transistor in each first pixel circuit of the plurality of first pixel circuits is a low-temperature polysilicon transistor, and a transistor in each second pixel circuit of the plurality of second pixel circuits is a low-temperature polycrystalline oxide transistor.

6. The display substrate according to claim 3, wherein, when n=j and m=k, a transistor in each first pixel circuit of the plurality of first pixel circuits is a low-temperature polycrystalline oxide transistor, and a transistor in each second pixel circuit of the plurality of second pixel circuits is a low-temperature polysilicon transistor.

7. The display substrate according to claim 1, wherein the light transmittance of the first display area is greater than a light transmittance of the second display area, and the light transmittance of the second display area is greater than the light transmittance of the third display area.

8. The display substrate according to claim 1, wherein the display substrate further comprises a plurality of first sub-pixels and a plurality of second sub-pixels;
some of the plurality of first sub-pixels are arranged in the first display area and arranged in an array, and the first sub-pixels are connected with the first pixel circuits;
some of the plurality of second sub-pixels are arranged in the third display area and arranged in an array, and the second sub-pixels are connected with the second pixel circuits; and
others of the plurality of first sub-pixels and others of the plurality of second sub-pixels are arranged in the second display area and arranged in an array, the first sub-pixels in the second display area are connected with the first pixel circuits in the second display area, and the second sub-pixels in the second display area are connected with the second pixel circuits in the second display area.

9. The display substrate according to claim 8, wherein the first sub-pixels and the second sub-pixels in the second display area are alternately distributed, the first sub-pixels in the second display area are uniformly distributed, the second sub-pixels in the second display area are uniformly distributed, and a density of the first sub-pixels in the second display area is substantially equal to a density of the second sub-pixels in the second display area.

10. The display substrate according to claim 8, wherein the number of the first sub-pixels in per unit area of the first display area is less than or equal to a sum of the number of the first sub-pixels and the number of the second sub-pixels in per unit area of the second display area, and the number of the first sub-pixels in per unit area of the first display area is less than or equal to the number of the second sub-pixels in per unit area of the third display area.

11. The display substrate according to claim 8, wherein each first sub-pixel of the plurality of first sub-pixels is different from each second sub-pixel of the plurality of second sub-pixels.

12. The display substrate according to claim 11, wherein a light transmittance of each first sub-pixel of the plurality of first sub-pixels is greater than a light transmittance of each second sub-pixel of the plurality of second sub-pixels.

13. The display substrate according to claim 8, wherein an opening area of each first sub-pixel of the plurality of first sub-pixels is smaller than an opening area of each second sub-pixel of the plurality of second sub-pixel, and a luminous intensity of each first sub-pixel is higher than a luminous intensity of each second sub-pixel.

14. The display substrate according to claim 8, wherein each first sub-pixel of the plurality of first sub-pixels further comprises:
a first electrode comprising f electrode blocks;
a first organic light emitting layer located on the first electrode, wherein the first organic light emitting layer comprises f light emitting structures correspondingly and respectively disposed on the f electrode blocks; and
a second electrode located on the first organic light emitting layer; wherein f is a positive integer.

15. The display substrate according to claim 14, wherein a projection of the first electrode in a plane where the display substrate is located comprises at least one graphic unit; and a shape of the graphic unit is circular, oval, dumbbell, gourd or rectangular.

16. The display substrate according to claim 1, wherein the first display area is at least partially surrounded by the second display area and the third display area.

17. The display substrate according to claim 1, wherein each first pixel circuit of the plurality of first pixel circuits is different from each second pixel circuit of the plurality of second pixel circuits.

18. A display panel, comprising:
the display substrate according to claim 1; and
an encapsulation layer, wherein the display substrate is encapsulated by the encapsulation layer.

19. A display device, comprising:
a device body having a component area; and
the display panel according to claim 18, wherein the display panel covers the device body, the component area is located under the first display area, and the device body comprises at least one electronic component arranged in the component area.

* * * * *